United States Patent
Steiner et al.

(10) Patent No.: US 12,374,880 B2
(45) Date of Patent: Jul. 29, 2025

(54) CIRCUIT BREAKER WITH PRE-CHARGING AND CURRENT LIMITING FUNCTIONS, METHOD OF OPERATING SAME, POWER SUPPLY CIRCUIT AND AIRCRAFT

(71) Applicant: Airbus (S.A.S.), Blagnac (FR)

(72) Inventors: Gerhard Steiner, Mindelheim (DE); Florian Kapaun, Kirchseeon (DE)

(73) Assignee: Airbus (S.A.S.), Blagnac (FR)

( * ) Notice: Subject to any disclaimer, the term of this patent is extended or adjusted under 35 U.S.C. 154(b) by 179 days.

(21) Appl. No.: 18/067,800

(22) Filed: Dec. 19, 2022

(65) Prior Publication Data

US 2023/0198249 A1    Jun. 22, 2023

(30) Foreign Application Priority Data

Dec. 20, 2021   (EP) .................................... 21215954

(51) Int. Cl.
  *H02H 9/02*    (2006.01)
  *H02H 3/02*    (2006.01)
  *H03K 17/60*   (2006.01)

(52) U.S. Cl.
  CPC .............. *H02H 9/02* (2013.01); *H02H 3/023* (2013.01); *H03K 17/60* (2013.01)

(58) Field of Classification Search
  CPC .......... H02H 3/023; H02H 3/08; H02H 9/001; H02H 9/02; H03K 17/60
  USPC ........................................................ 361/93.9
  See application file for complete search history.

(56) References Cited

U.S. PATENT DOCUMENTS

| | | | | |
|---|---|---|---|---|
| 5,805,393 | A | * | 9/1998 | Thomas ................. H02H 9/026 361/13 |
| 6,201,678 | B1 | * | 3/2001 | Kolbas .................... H02H 9/001 361/8 |
| 2012/0025768 | A1 | | 2/2012 | Nakano et al. |
| 2012/0068532 | A1 | * | 3/2012 | Tanabe ................. B60L 3/0007 340/436 |

FOREIGN PATENT DOCUMENTS

| | | | |
|---|---|---|---|
| CN | 110 932 357 A | 3/2020 | |
| WO | WO-2018214263 A1 * | 11/2018 | ................ H02J 7/00 |

OTHER PUBLICATIONS

Machine translation of Chen et al. International Patent Document WO 2018214263 A1 Nov. 2018 (Year: 2018).*
Kamal Ahmad et al, "Ultrafast Sub-m[Omega] Battery Switching Module Using SiC JFETS for Hybrid Electric Aircraft Propulsion Applications", 2021 IEEE Applied Power Electronics Conference and Exposition, Jun. 14, 2021, pp. 829-834.
European Search Report for Application No. 21215954 dated Jun. 23, 2022.

* cited by examiner

*Primary Examiner* — Kevin J Comber
(74) *Attorney, Agent, or Firm* — KDW Firm PLLC

(57) ABSTRACT

A circuit breaker with pre-charging and current limiting functions, wherein the circuit breaker is configured for being provided in a power line connecting an electrical energy source and an electric network. The circuit breaker includes a short circuit protection unit including a first semiconductor switch, a precharge unit connected in parallel to the short circuit protection unit and including a second semiconductor switch, and a current limit unit connected in parallel to the short circuit protection unit and to the precharge unit, the current limit unit including a third semiconductor switch.

13 Claims, 2 Drawing Sheets

CIRCUIT BREAKER WITH PRE-CHARGING AND CURRENT LIMITING FUNCTIONS, METHOD OF OPERATING SAME, POWER SUPPLY CIRCUIT AND AIRCRAFT

TECHNICAL FIELD

The disclosure herein relates to a circuit breaker with pre-charging and current limiting functions, a method of operating a circuit breaker with pre-charging and current limiting functions, a power supply circuit, and an aircraft.

BACKGROUND

In the field of power electronics, to which the disclosure herein is mainly related, there are still existing problems in connecting energy sources to a power network, as well as in operating and protecting them. Especially for energy sources like batteries and fuel cells, frontends are mandatory to ensure a safe operation of the system. In case of a malfunction in the power network, high currents may occur. Therefore, the consumer or power network must be disconnected very quickly from the energy source to avoid a destruction of the energy source.

Further, during power up, high inrush currents may occur, in particular for power networks with capacitive loads. Current spikes of thousands or even ten thousands of amps may damage system components. For example, contactors may weld and cannot be reopened again. In addition, electric arcs may be formed when contactors are opened, leading to hot areas which melt and thus damage the respective component.

FIG. 1 shows a state-of-the-art solution, which combines a fuse 110, a resistor based precharge circuit 111 and a power contactor 112 to ensure the basic functionality. This principle is mainly used in the field of automotive. A battery 113 is connected to a high voltage DC network 114 via positive power line 115 and negative power line 116. Power contactor 112, which forms a first main contactor, is connected in series with fuse 110 and placed in positive power line 115. A second main contactor 112 is provided in negative power line 116. The precharge circuit 111 comprises a precharge resistor 117 connected in series with a precharge contactor 118.

This solution is in principle simple and comprises easy to drive devices like a fuse, a resistor and a contactor, and is sufficient for many applications. But it gets more complicated if, e.g., contact welding and cell damage should be avoided.

A drawback of these kind of solutions is the limited performance of the functional bricks. The precharge resistor heats up when it is operating, e.g. to a temperature of about 100° C. A relatively long time is needed for cooling down so that a next precharge or switching operation can be performed. Further, the resistor-based precharge has to be precisely adapted to the load. It is usually designed for a single precharge event with quite a long time to cool down.

A combination of a fuse in series with contactors has to be precisely matched to ensure protection to overload and short circuit over the whole operational range. At the moment a short circuit in combination with a powerful energy source like, e.g., a battery or fuel cell leads to overload and damage of the contactor and the energy source before the fuse is blown.

In particular, the following limitations exist in the topology shown in FIG. 1. Only a limited energy is possible for the precharge circuit. Thus, only a limited network capacitance precharge is possible. The system is usually designed for one precharge event. In most designs multiple precharge tries will lead to overheating of the resistor. There is no current limiting functionality if main contactors are closed. Matching of fuse and contactor performance is necessary, but not always for 100% possible. In addition, the needs of application in aircrafts are not considered in the actual stage, in particular with respect to electric aircraft propulsion.

SUMMARY

It is an object of the disclosure herein to provide a solution for precharging and protecting energy sources from overload and short circuit, which has improved flexibility and enhanced performance.

The object is achieved by a circuit breaker, a method of operating a circuit breaker, a power supply circuit, and an aircraft as disclosed herein.

According to a first aspect, the disclosure herein provides a circuit breaker with pre-charging and current limiting functions, wherein the circuit breaker is configured for being provided in a power line connecting an electrical energy source and an electric network, comprising: a short circuit protection unit comprising a first semiconductor switch, a precharge unit connected in parallel to the short circuit protection unit and comprising a second semiconductor switch, and a current limit unit connected in parallel to the short circuit protection unit and to the precharge unit, the current limit unit comprising a third semiconductor switch.

Preferably, the circuit breaker is designed for a) activating the precharge unit while the short circuit protection unit is deactivated during power-up of the electric network, b) keeping the short circuit protection unit active during nominal operation, and c) deactivating the short circuit protection unit in case of a short circuit, while the current limit unit is active.

Preferably, the precharge unit comprises a current limiting element connected in series with the second semiconductor switch.

Preferably, the current limit unit comprises a current limiting element connected in series with the third semiconductor switch.

Preferably, the circuit breaker is configured for being connected in series with a main contactor in the power line.

Preferably, the circuit breaker is connected in series with a fuse unit in the power line.

Preferably, the circuit breaker is configured for disabling the short circuit protection unit if the output current from the electrical energy source is higher than a predetermined threshold value, while the precharge unit and the current limit unit stay active preferably for a predefined time period.

Preferably, the circuit breaker is configured for disabling the precharge unit and/or the current limit unit if the output current is still above the nominal operation value after the predefined time period.

According to a second aspect, the disclosure herein provides a method of operating a circuit breaker with pre-charging and current limiting functions, wherein the circuit breaker is designed for being provided in a power line connecting an electrical energy source and an electric network, the method comprising the steps: a) providing a short circuit protection unit of the circuit breaker in an initial deactivated state for interrupting a current; b) meanwhile performing a precharge operation by a precharge unit of the circuit breaker, the precharge unit being connected in parallel to the short circuit protection unit; c) activating a current limit unit connected in parallel to the precharge unit and to the short circuit unit to allow a limited current in the power line; and d) finally activating the short circuit protection unit to allow a nominal current therethrough.

Preferably, the method comprises the following steps for de-activation of the circuit breaker: a) de-activating the short circuit protection unit for interrupting the current therethrough; b) thereafter de-activating the current limit unit for interrupting the current therethrough; and c) de-activating the precharge unit if it is active.

Preferably, a circuit breaker according to the disclosure herein is used.

According to a third aspect, the disclosure herein provides a power supply circuit comprising an electrical energy source and an electric network, wherein the power supply circuit comprises a circuit breaker according to the disclosure herein.

Preferably, the power supply circuit comprises a fuse unit and/or a main contactor which are connected in series with the circuit breaker.

Preferably, the energy source comprises a battery unit and/or a fuel cell unit, and the electric network comprises an electric machine, in particular for propelling an aircraft.

According to a fourth aspect, the disclosure herein provides an aircraft comprising a power supply circuit according to the disclosure herein.

The disclosure herein provides a solution for precharging and protecting energy sources to overload as well as to short circuit. It achieves improved flexibility and enhanced performance combined with low weight compared to actual solutions. The disclosure herein relaxes a lot the requirements to the main contactors in terms of load switching capability. Therefore, contactor types like, e.g., contactors without arc chambers ensuring load switching performance can be used which were not possible to be used without the disclosure herein in order to improve the overall performance, e.g., in terms of weight, outlines, safety, installation location and more.

In particular, the disclosure herein provides a hybrid circuit breaker with precharge and current limiting function.

Characteristics and advantages described in relation to the circuit breaker are also related to the method of operating it, to the power supply circuit, to the aircraft, and vice versa.

BRIEF DESCRIPTION OF THE DRAWINGS

In the following, example embodiments showing further advantages and characteristics are described in detail with reference to the figures, in which.

DETAILED DESCRIPTION

Figure 1:
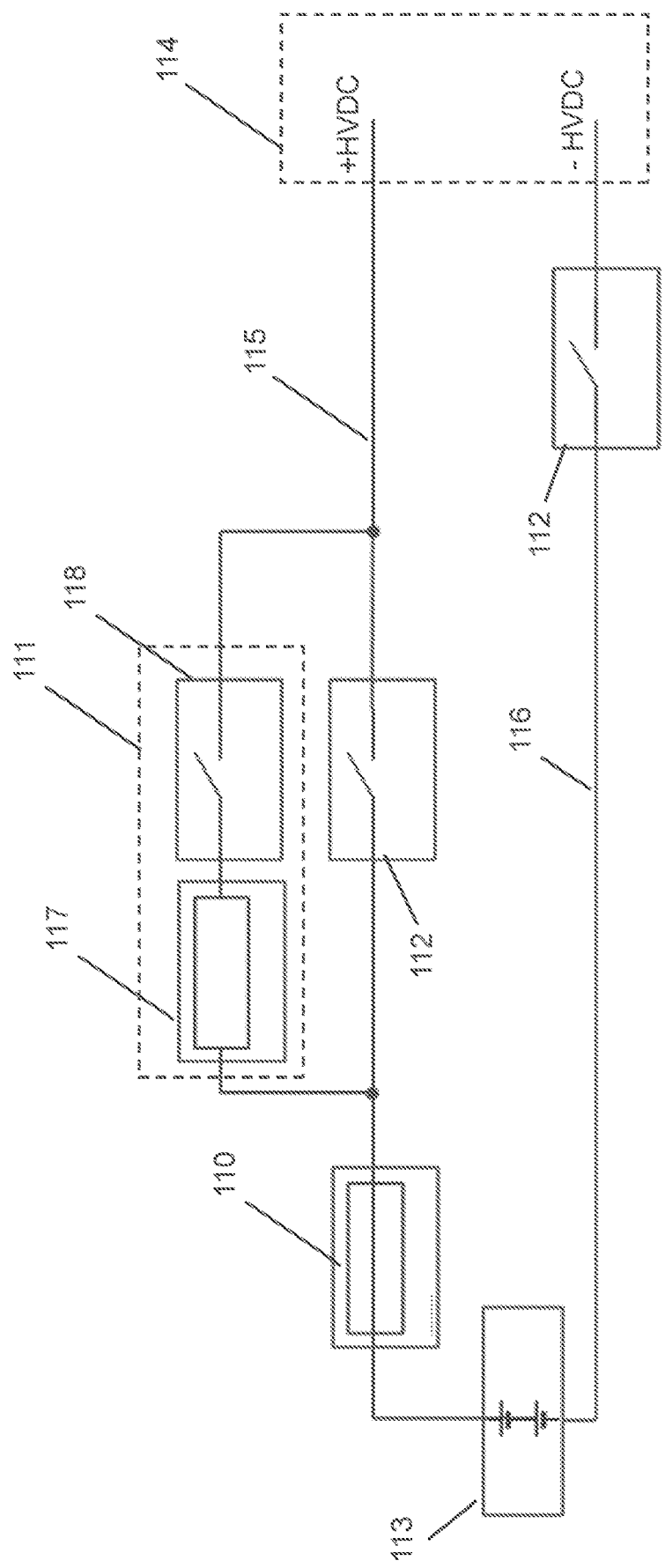
FIG. 1 shows a schematic structural diagram of a power supply circuit comprising a circuit breaker arrangement according to the prior art.

FIG. 1 showing the state of the art has already been described above.

Figure 2:
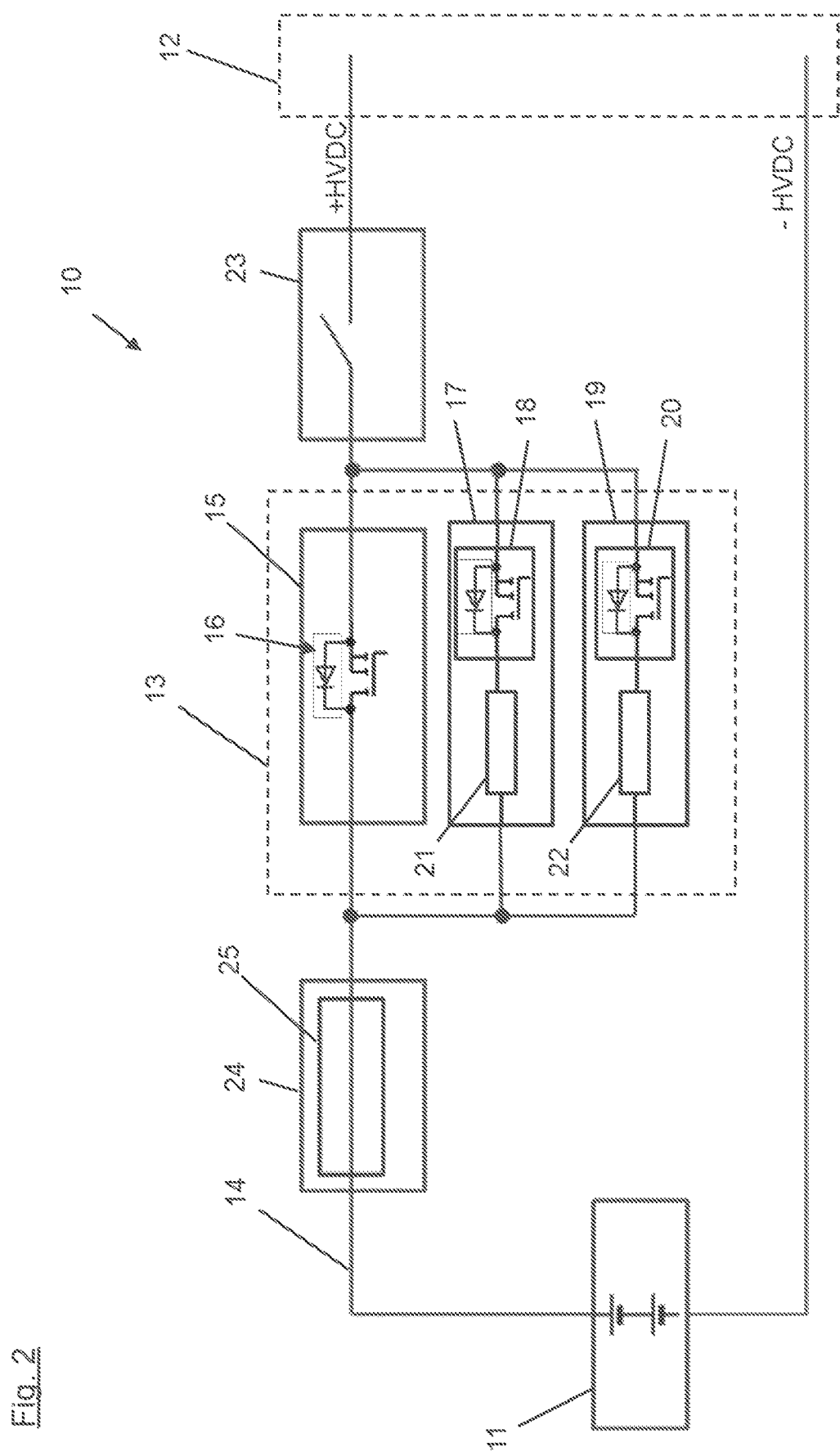
FIG. 2 shows a schematic structural diagram of a power supply circuit comprising a circuit breaker arrangement according to a preferred embodiment of the disclosure herein.

FIG. 2 shows a power supply circuit 10, in which an electrical energy source formed by a battery 11 is connected to an electric network 12 which may comprise, e.g., an electrical machine like, e.g., a motor as a consumer.

A circuit breaker 13 according to a preferred embodiment of the disclosure herein is provided in a power line 14 connecting the electrical energy source or battery 11 with network 12 which forms an electric consumption network. Circuit breaker 13 forms a hybrid circuit breaker with pre-charge and current limiting functions. It comprises a short circuit protection unit 15 comprising a first semiconductor switch 16, a precharge unit 17 comprising a second semiconductor switch 18, and a current limit unit 19 comprising a third semiconductor switch 20. Short circuit protection unit 15, precharge unit 17 and current limit unit 19 are connected in parallel to each other.

The electrical energy source 11 is not limited to a battery. It may also be formed, e.g., by a fuel cell unit or arrangement, or another device for supplying electric energy to a network or consumer unit. The electric network 12 is a high voltage DC network.

The circuit breaker 13 is connected in series with a main contactor 23 and with a fuse unit 24 comprising a fuse 25 in the power line 14.

The circuit breaker 13, which may also be named a circuit breaker arrangement, is designed for performing several functions. One of these functions is pre-charging. For powering up the system and pre-charging, short circuit protection unit 15 is deactivated, i.e. first semiconductor switch 16 is disabled. In this state, main contactor 23 is activated. Then, by enabling second semiconductor switch 18, precharge unit 17 is activated to perform pre-charging.

In this way, high inrush currents which may occur due to capacities in the electric network 12, and which could damage components of the system, are prevented by charging precharge unit 17 and deactivating or keeping deactivated short circuit protection unit 15 for a certain period of time at the beginning when the system or network 12 is powered up. The components which are protected from being damaged are, e.g., components of the electrical energy source 11, like, e.g., battery cells or fuel cells, and other components like, e.g., switches etc.

A further function of circuit breaker 13 is limiting the output current of the electrical energy source 11. For this purpose, after activation of precharge unit 17, the current limit unit 19 is activated by enabling semiconductor switch 20.

After activation of current limit unit 19, the short circuit protection unit 15 is activated by enabling its semiconductor switch 16. The short circuit protection unit 15 is kept active during nominal operation of the system comprising electrical energy source 11 and network 12. As current limit unit 19 is of high resistance, in contrast to the very low forward resistance of semiconductor switch 16 of short circuit protection unit 15, the current still flows through short circuit protection unit 15 when current limit unit 19 is active.

Short circuit protection unit 15 is designed for protecting the electrical energy source 11 and the electric network 12 in case of a short circuit or overload which may, e.g., occur in the electric network 12 during operation. In case of such failure or malfunction, the short circuit protection unit interrupts the current by the first semiconductor switch 16.

If the output current becomes greater than a predefined limit, e.g., by a short circuit, the short circuit protection unit 15 will be disabled and thus interrupts the current therethrough. The time needed for disabling short circuit protection unit 15 is very low. It may be, e.g., in the range of about 10 microseconds. This is the result of the first semiconductor switch 16 which is very fast. It may be formed, e.g., by an IGBT (Insulated Gate Bipolar Transistor) switch or SIC (Silicon Carbide) switching module. Preferably, also second and third semiconductor switches 18, 20 are formed in this way.

After disabling short circuit protection unit 15, only precharge unit 17 and current limit unit 19 stay active. Thus, the energy is limited. Depending on specific requirements, the current limiter 19 is feeding the load with a slightly reduced current in this case. Thus, the current is reduced by circuit breaker 13 instead of suddenly being completely interrupted.

Preferably, the precharge and current limit units 17, 19 stay active for a defined maximum time period t1. If the current is still too high after t1, i.e., above the nominal operating current, also the precharge and current limit units 17, 19 will be disabled.

Precharge unit 17 comprises a current limiting element or precharge resistor 21 connected in series with second semiconductor switch 18. Similarly, current limit unit 19 comprises a current limiting element 22. The current limiting elements or current limiters 21, 22 may, e.g., be clocked or regulated. They may comprise a resistor, a resistor combined with an inductivity, and/or a more complex circuit for an additional function, like, e.g., a DC-DC converter.

A further function of circuit breaker 13 is the controlled deactivation of the power supply system 10. For this, circuit breaker 13 is configured or operated to deactivate the short circuit protection unit 15 first. Thereafter, the current limit unit 19 deactivated. Optionally, if still active, the precharge unit 17 is deactivated. Finally, the main contactor 23 is deactivated.

The current is measured by a current measurement device not shown in the figure. A control unit connected to the current measurement device and also not shown in the figure is configured for controlling circuit breaker 13 depending on the measured current.

An example of a method of operating a circuit breaker with pre-charging and current limiting functions is described in the following with reference to FIG. 2.

The circuit breaker 13 is designed for being provided in power line 14 connecting electrical energy source 11 and electric network 12. In this example, the circuit breaker 13 is configured as described above. The method comprises the following steps:

A) Providing short circuit protection unit 15 of circuit breaker 13 in an initial deactivated state in which a current is interrupted.

B) Performing a precharge operation by precharge unit 17 of circuit breaker 13, while short circuit protection unit 15 is disabled. Precharge unit 17 is being connected in parallel to short circuit protection unit 15. Main contactor 23 is activated for this step and stays active.

C) Activating current limit unit 19 connected in parallel to the precharge unit 17 and to short circuit protection unit 15 to allow a limited current in power line 14.

D) Finally, activating short circuit protection unit 15 to allow a nominal current therethrough.

The method may comprise the following steps for de-activation of circuit breaker 13:

A) De-activating short circuit protection unit 15 in order to interrupt the current therethrough. This may be initiated by a short current or overload, i.e. when the current is greater than a predefined limit. It may also be initiated to shut down the system.

B) Thereafter, de-activating current limit unit 19 in order to interrupt the current therethrough. This may be performed after a defined time period t1 when the current is still too high.

C) De-activating the precharge unit 17 if it is active.

Finally, main contactor 23 may be deactivated.

The disclosure herein protects energy sources like in particular batteries or fuel cells from short circuit currents and main contactors from welding and damage. In particular, the disclosure herein provides a hybrid topology comprising resistor and semiconductor elements with additional short-time current limiting functionality.

The subject matter disclosed herein can be implemented in or with software in combination with hardware and/or firmware. For example, the subject matter described herein can be implemented in or with software executed by a processor or processing unit. In one example implementation, the subject matter described herein can be implemented using a computer readable medium having stored thereon computer executable instructions that when executed by a processor of a computer control the computer to perform steps. Example computer readable mediums suitable for implementing the subject matter described herein include non-transitory devices, such as disk memory devices, chip memory devices, programmable logic devices, and application specific integrated circuits. In addition, a computer readable medium that implements the subject matter described herein can be located on a single device or computing platform or can be distributed across multiple devices or computing platforms.

While at least one example embodiment of the invention(s) is disclosed herein, it should be understood that modifications, substitutions and alternatives may be apparent to one of ordinary skill in the art and can be made without departing from the scope of this disclosure. This disclosure is intended to cover any adaptations or variations of the example embodiment(s). In addition, in this disclosure, the terms "comprise" or "comprising" do not exclude other elements or steps, the terms "a", "an" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

LIST OF REFERENCE NUMBERS

10 power supply circuit
11 battery
12 electric network
13 circuit breaker
14 power line
15 short circuit protection unit
16 first semiconductor switch
17 precharge unit
18 second semiconductor switch
19 current limit unit
20 third semiconductor switch
21 current limiting element/precharge resistor
22 current limiting element
23 main contactor
24 fuse unit
25 fuse

The invention claimed is:

1. A circuit breaker with pre-charging and current limiting functions, wherein the circuit breaker is configured for being connected in series with a main contactor in a power line connecting an electrical energy source and an electric network, comprising:
    a short circuit protection unit comprising a first semiconductor switch;
    a precharge unit connected in parallel to the short circuit protection unit and comprising a second semiconductor switch; and
    a current limit unit connected in parallel to the short circuit protection unit and to the precharge unit, the current limit unit comprising a third semiconductor switch connected in series with a current limiting element, the current limiting element comprising a resistor.

2. The circuit breaker according to claim 1, configured for:
    activating the precharge unit while the short circuit protection unit is deactivated during power-up of the electric network;
    keeping the short circuit protection unit active during nominal operation; and
    deactivating the short circuit protection unit in case of a short circuit or overload, while the current limit unit is active.

3. The circuit breaker according to claim 1, wherein the precharge unit comprises a current limiting element connected in series with the second semiconductor switch.

4. The circuit breaker according to claim 1, wherein it is connected in series with a fuse unit in the power line.

5. The circuit breaker according to claim 1, configured for deactivating the short circuit protection unit if an output current from the electrical energy source is higher than a predetermined threshold value, while the precharge unit and the current limit unit stay active for a predefined time period.

6. The circuit breaker according to claim 5, configured for deactivating the precharge unit and/or the current limit unit if the output current is still above a nominal operation value after the predefined time period.

7. A method of operating a circuit breaker with pre-charging and current limiting functions, wherein the circuit breaker is connected in series with a main contactor in a power line connecting an electrical energy source and an electric network, comprising:
    a) providing a short circuit protection unit of the circuit breaker in an initial deactivated state for interrupting a current;
    b) while the short circuit protection unit is in the initial deactivated state, performing a precharge operation by a precharge unit of the circuit breaker which is connected in parallel to the short circuit protection unit and activating the main contactor;
    c) following the precharge operation, activating a current limit unit connected in parallel to the precharge unit and to the short circuit protection unit to allow a limited current in the power line, the current limit unit having a relatively higher resistance in comparison to the short circuit protection unit; and
    d) finally activating the short circuit protection unit to allow a nominal current therethrough.

8. The method according to claim 7, comprising steps for de-activation of the circuit breaker comprising:
    a) de-activating the short circuit protection unit for interrupting the current therethrough;
    b) thereafter de-activating the current limit unit for interrupting the current therethrough;
    c) de-activating the precharge unit if it is active; and
    d) de-activating the main contactor.

9. The method according to claim 7, wherein a circuit breaker is used, the circuit breaker comprising:
    a circuit breaker with pre-charging and current limiting functions, wherein the circuit breaker is configured for being connected in series with the main contactor in a power line connecting an electrical energy source and an electric network, comprising;
    a short circuit protection unit comprising a first semiconductor switch;
    a precharge unit connected in parallel to the short circuit protection unit and comprising a second semiconductor switch; and
    a current limit unit connected in parallel to the short circuit protection unit and to the precharge unit, the current limit unit comprising a third semiconductor switch connected in series with a current limiting element, the current limiting element comprising a resistor.

10. A power supply circuit comprising:
    an electrical energy source;
    an electric network;
    a main contactor provided in a power line connecting the electrical energy source and the electric network; and
    a circuit breaker connected in series with the main contactor, the circuit breaker comprising:
        a short circuit protection unit comprising a first semiconductor switch;
        a precharge unit connected in parallel to the short circuit protection unit and comprising a second semiconductor switch; and
        a current limit unit connected in parallel to the short circuit protection unit and to the precharge unit, the current limit unit comprising a third semiconductor switch connected in series with a current limiting element, the current limiting element comprising a resistor.

11. The power supply circuit according to claim 10, comprising a fuse unit connected in series with the circuit breaker.

12. The power supply circuit according to claim 10, wherein the energy source comprises a battery unit and/or a fuel cell unit, and the electric network comprises an electric machine or an electric machine for propelling an aircraft.

13. An aircraft comprising the power supply circuit according to claim 10.

* * * * *